United States Patent
Wu et al.

(10) Patent No.: US 8,681,528 B2
(45) Date of Patent: Mar. 25, 2014

(54) ONE-BIT MEMORY CELL FOR NONVOLATILE MEMORY AND ASSOCIATED CONTROLLING METHOD

(75) Inventors: Meng-Yi Wu, Kaohsiung (TW);
Yueh-Chia Wen, Taoyuan County (TW);
Hsin-Ming Chen, Hsinchu (TW);
Ching-Sung Yang, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 49 days.

(21) Appl. No.: 13/590,392

(22) Filed: Aug. 21, 2012

(65) Prior Publication Data
US 2014/0056051 A1  Feb. 27, 2014

(51) Int. Cl.
*G11C 17/00* (2006.01)

(52) U.S. Cl.
USPC ........................................... 365/104; 365/149

(58) Field of Classification Search
CPC ..................... G11C 17/123; G11C 11/4045
USPC ................................................ 365/104, 149
See application file for complete search history.

(56) References Cited

U.S. PATENT DOCUMENTS

| | | | |
|---|---|---|---|
| 6,791,891 B1 | 9/2004 | Peng et al. | |
| 7,402,855 B2 | 7/2008 | Kurjanowicz | |
| 7,642,138 B2 | 1/2010 | Kurjanowicz | |
| 2002/0131299 A1* | 9/2002 | Yamazoe et al. | 365/185.1 |
| 2007/0268744 A1* | 11/2007 | Taguchi | 365/185.01 |
| 2011/0249484 A1* | 10/2011 | Takemura | 365/72 |

* cited by examiner

*Primary Examiner* — Hoai V Ho
(74) *Attorney, Agent, or Firm* — WPAT, PC; Justin King

(57) ABSTRACT

A one-bit memory cell for a nonvolatile memory includes a bit line and a plurality of serially-connected storage units. The bit line is connected to the serially-connected storage units. Each storage unit includes a first doped region, a second doped region and a third doped region, which are formed in a surface of a substrate. A first gate structure is disposed over a first channel region between the first doped region and the second doped region. The first gate structure is connected to a control signal line. A second gate structure is disposed over a second channel region between the second doped region and the third doped region. The second gate structure is connected to an anti-fuse signal line.

24 Claims, 12 Drawing Sheets

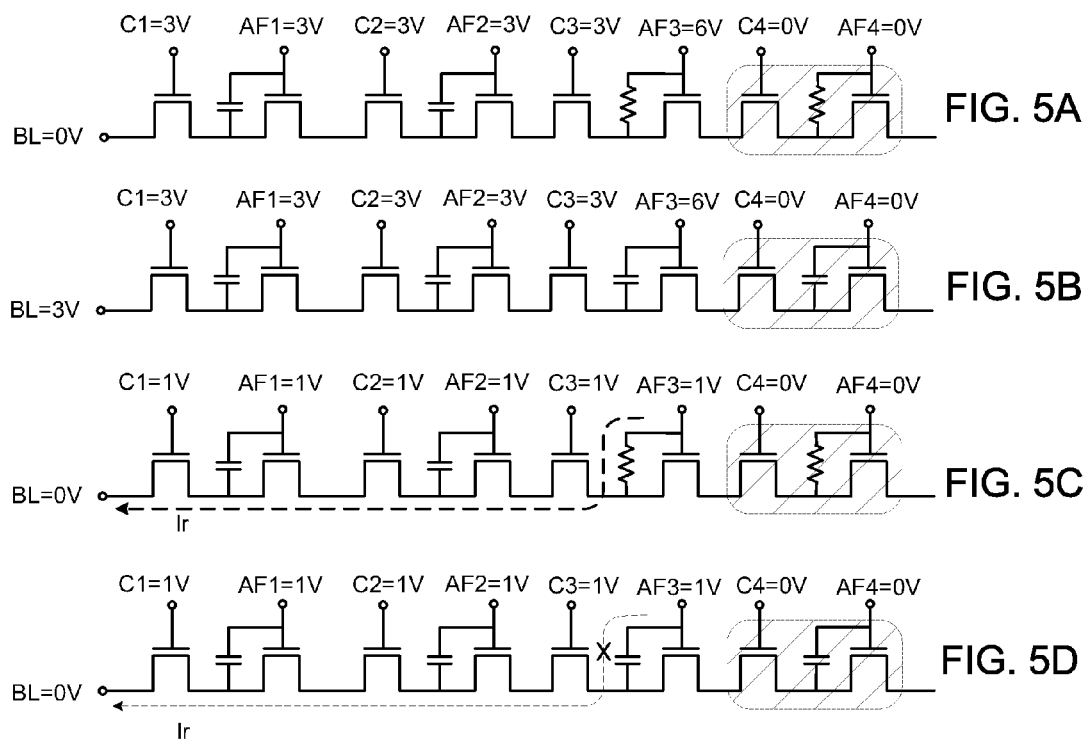

ONE-BIT MEMORY CELL FOR NONVOLATILE MEMORY AND ASSOCIATED CONTROLLING METHOD

FIELD OF THE INVENTION

The present invention relates to a nonvolatile memory, and more particularly to a one-bit memory cell for a nonvolatile memory. The present invention also relates to a method for controlling the one-bit memory cell.

BACKGROUND OF THE INVENTION

As is well known, a nonvolatile memory is able to continuously record data after the supplied power is interrupted. Consequently, the nonvolatile memory is widely used in a variety of electronic products.

Generally, the nonvolatile memory may be implemented by floating gate transistors or anti-fuse transistors. By using a proper controlling mechanism, hot carriers may be injected into or ejected from the floating gate of the floating gate transistor. Consequently, the nonvolatile memory composed of floating gate transistors may be used as a multi-time programming memory (also referred as a MTP memory).

Moreover, the storage state of the anti-fuse transistor is determined according to the ruptured state of the gate oxide layer of the anti-fuse transistor. After the gate oxide layer is ruptured, the gate oxide layer fails to be recovered. Consequently, the nonvolatile memory composed of anti-fuse transistors may be used as a one time programming memory (also referred as an OTP memory).

The nonvolatile memory composed of anti-fuse transistors is disclosed in for example U.S. Pat. Nos. 7,402,855 and 6,791,891. However, the one time programming memory fails to be repeatedly programmed and lacks the characteristics of the multi-time programming memory.

SUMMARY OF THE INVENTION

The present invention provides a one-bit memory cell for a nonvolatile memory and a method for controlling the one-bit memory cell. The one-bit memory cell includes a plurality of storage units. Each storage unit is a combination of a control transistor and an anti-fuse transistor. The one-bit memory cell of the present invention may be used as a multi-time programming memory or a one time programming memory.

A first embodiment of the present invention provides a nonvolatile memory. The nonvolatile memory includes a first one-bit memory cell. The first one-bit memory cell is formed on a substrate. The first one-bit memory cell includes a first bit line and N storage units. Each of the N storage units includes a first doped region, a second doped region and a third doped region, which are formed in a surface of the substrate. A first gate structure is disposed over a first channel region between the first doped region and the second doped region. A second gate structure is disposed over a second channel region between the second doped region and the third doped region. The first doped region of the first storage unit is connected to the first bit line. The first gate structure of the first storage unit is connected to a first control signal line. The second gate structure of the first storage unit is connected to a first anti-fuse signal line. The first doped region of the m-th storage unit is connected to the third doped region of the (m−1)-th storage unit. The first gate structure of the m-th storage unit is connected to an m-th control signal line. The second gate structure of the m-th storage unit is connected to an m-th anti-fuse signal line, wherein m is an integer larger than or equal to 2 and smaller than or equal to N.

A second embodiment of the present invention provides a nonvolatile memory. The nonvolatile memory includes a first one-bit memory cell. The first one-bit memory cell is formed on a substrate. The first one-bit memory cell includes a first bit line and N storage units. The N storage units are connected with each other in series. Each of the N storage units includes a control transistor and an anti-fuse transistor. A first terminal of the control transistor of the first storage unit is connected to the first bit line. A gate terminal of the control transistor of the first storage unit is connected to a first control signal line. A second terminal of the control transistor of the first storage unit is connected to a first terminal of the anti-fuse transistor of the first storage unit. A gate terminal of the anti-fuse transistor of the first storage unit is connected to a first anti-fuse signal line. A first terminal of the control transistor of the m-th storage unit is connected to a second terminal of the anti-fuse transistor of the (m−1)-th storage unit. A gate terminal of the control transistor of the m-th storage unit is connected to an m-th control signal line. A second terminal of the control transistor of the m-th storage unit is connected to a first terminal of the anti-fuse transistor of the m-th storage unit. A gate terminal of the anti-fuse transistor of the m-th storage unit is connected to an m-th anti-fuse signal line, wherein m is an integer larger than or equal to 2 and smaller than or equal to N.

A third embodiment of the present invention provides a nonvolatile memory. The nonvolatile memory includes a first one-bit memory cell. The first one-bit memory cell is formed on a substrate. The first one-bit memory cell includes a first bit line and N storage units. Each of the N storage units includes a first doped region and a second doped region, which are formed in a surface of the substrate. A gate structure is disposed over a channel region between the first doped region and the second doped region. The gate structure includes a gate oxide layer and a gate conductor layer. The gate oxide layer includes a first part and a second part. The first part is thicker than the second part. The gate conductor layer is formed over the gate oxide layer. The first doped region of the first storage unit is connected to the first bit line. The gate structure of the first storage unit is connected to a first control signal line and a first anti-fuse signal line. The first doped region of the m-th storage unit is connected to the second doped region of the (m−1)-th storage unit. The gate structure of the m-th storage unit is connected to an m-th control signal line and an m-th anti-fuse signal line, wherein m is an integer larger than or equal to 2 and smaller than or equal to N.

A fourth embodiment of the present invention provides a method for controlling a one-bit memory cell of a nonvolatile memory. The one-bit memory cell includes a bit line and N storage units. The N storage units are connected with each other in series. The bit line is connected to the N storage units. The method includes the following steps. If the one-bit memory cell needs to be programmed, a x-th storage unit is programmed, so that a storage state of the x-th storage unit is provided when the one-bit memory cell is read. If the one-bit memory cell needs to be erased and re-programmed again, a (x−1)-th storage unit is sequentially adopted for programming instead of x-th storage unit, so that a storage state of the (x−1)-th storage unit is provided when the one-bit memory cell is read, wherein x is an integer larger than or equal to 2 and smaller than or equal to N.

A fifth embodiment of the present invention provides a method for controlling a one-bit memory cell of a nonvolatile memory. The one-bit memory cell includes a bit line and N storage units. The N storage units are connected with each other in series. The bit line is connected to the N storage units. The method includes the following steps. If the one-bit memory cell needs to be programmed, the N storage units are sequentially programmed in N program cycles, so that a storage state is recorded into all of the N storage units. If the one-bit memory cell needs to be read, the storage state of the N storage units is provided simultaneously.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 5A~5D schematically illustrate the voltages of associated signals applied to the one-bit memory cell when the one-bit memory cell is programmed and read at the second time;

DETAILED DESCRIPTION OF PREFERRED EMBODIMENTS

Figure 1A:
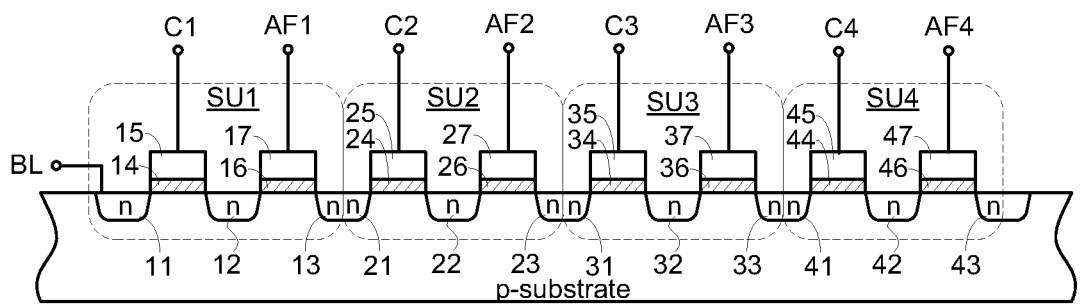
FIG. 1A is a schematic cross-sectional view illustrating a one-bit memory cell for a nonvolatile memory according to a first embodiment of the present invention.

FIG. 1A is a schematic cross-sectional view illustrating a one-bit memory cell for a nonvolatile memory according to a first embodiment of the present invention. The one-bit memory cell is formed on a p-substrate, and comprises a plurality of serially-connected storage units. For clarification and brevity, only four storage units SU1, SU2, SU3 and SU4 are shown in FIG. 1A. Of course, the number of the serially-connected storage units may be varied according to the practical requirements.

The first storage unit SU1 comprises a first n-doped region 11, a second n-doped region 12 and a third n-doped region 13, which are formed in the surface of the p-substrate. Moreover, the first n-doped region 11 is connected to a bit line (BL). A first channel region is formed between the first n-doped region 11 and the second n-doped region 12. A first gate structure is disposed over the first channel region. A second channel region is formed between the second n-doped region 12 and the third n-doped region 13. A second gate structure is disposed over the second channel region. The first gate structure comprises a first gate oxide layer 14 and a first gate conductor layer 15. The second gate structure comprises a second gate oxide layer 16 and a second gate conductor layer 17. The first gate conductor layer 15 is connected to a first control signal line C1. The second gate conductor layer 17 is connected to a first anti-fuse signal line AF1.

The configurations of each of the other storage units SU2, SU3 and SU4 are similar to those of the first storage unit SU1. That is, the second storage unit SU2 comprises a first n-doped region 21, a second n-doped region 22, and a third n-doped region 23; the third storage unit SU3 comprises a first n-doped region 31, a second n-doped region 32, and a third n-doped region 33; and the fourth storage unit SU4 comprises a first n-doped region 41, a second n-doped region 42, and a third n-doped region 43. Moreover, each of the storage units SU2, SU3 and SU4 has a first gate structure and a second gate structure. The first gate structure of the second storage unit SU2 comprises a first gate oxide layer 24 and a first gate conductor layer 25, and the second gate structure of the second storage unit SU2 comprises a second gate oxide layer 26 and a second gate conductor layer 27. The first gate structure of the third storage unit SU3 comprises a first gate oxide layer 34 and a first gate conductor layer 35, and the second gate structure of the third storage unit SU3 comprises a second gate oxide layer 36 and a second gate conductor layer 37. The first gate structure of the fourth storage unit SU4 comprises a first gate oxide layer 44 and a first gate conductor layer 45, and the second gate structure of the fourth storage unit SU4 comprises a second gate oxide layer 46 and a second gate conductor layer 47.

In the second storage unit SU2, the first gate conductor layer 25 is connected to a second control signal line C2, and the second gate conductor layer 27 is connected to a second anti-fuse signal line AF2. In the third storage unit SU3, the first gate conductor layer 35 is connected to a third control signal line C3, and the second gate conductor layer 37 is connected to a third anti-fuse signal line AF3. In the fourth storage unit SU4, the first gate conductor layer 45 is connected to a fourth control signal line C4, and the second gate conductor layer 47 is connected to a fourth anti-fuse signal line AF4.

Please refer to FIG. 1A again. The third n-doped region 13 of the first storage unit SU1 and the first n-doped region 21 of the second storage unit SU2 are located adjacent to each other, so that the first storage unit SU1 and the second storage unit SU2 are connected with each other in series. In the practical semiconductor fabricating process, only an n-doped region is formed, wherein a portion of this n-doped region is served as the third n-doped region 13 of the first storage unit SU1 and the other portion of this n-doped region is served as the first n-doped region 21 of the second storage unit SU2. The other serially-connected storage units are produced by the similar semiconductor fabricating process, and are not redundantly described herein.

Figure 1B:
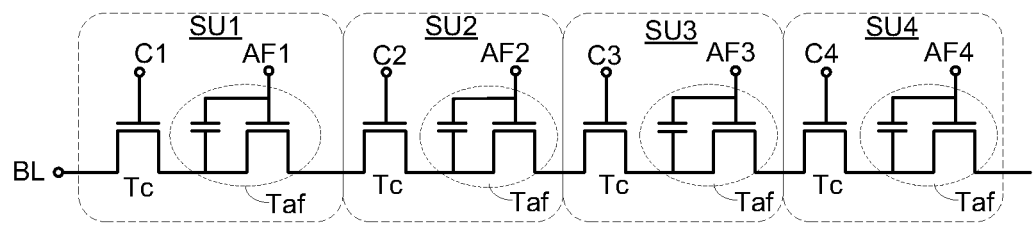
FIG. 1B is a schematic equivalent circuit of the one-bit memory cell of FIG. 1A.

FIG. 1B is a schematic equivalent circuit of the one-bit memory cell of FIG. 1A. The first n-doped region 11, the second n-doped region 12 and the first gate structure of the first storage unit SU1 are collaboratively defined as a control transistor Tc. The second n-doped region 12, the third n-doped region 13 and the second gate structure are collaboratively defined as an anti-fuse transistor Taf. The control transistor Tc and the anti-fuse transistor Taf are connected with each other in series. Similarly, each of the storage units SU2, SU3 and SU4 comprises a control transistor Tc and an anti-fuse transistor Taf, which are connected with each other in series.

Generally, if the gate oxide layer of the anti-fuse transistor Tf is ruptured, the both ends of the capacitor have low impedance. Meanwhile, the storage unit may be considered to be in an on state or a first state.

Whereas, if the gate oxide layer of the anti-fuse transistor Tf is not ruptured, the anti-fuse transistor Tf may be considered to have a capacitor and a switch element, which are connected with each other in parallel. Under this circumstance, the storage unit may be considered to be in an off state or a second state.

Figure 2:
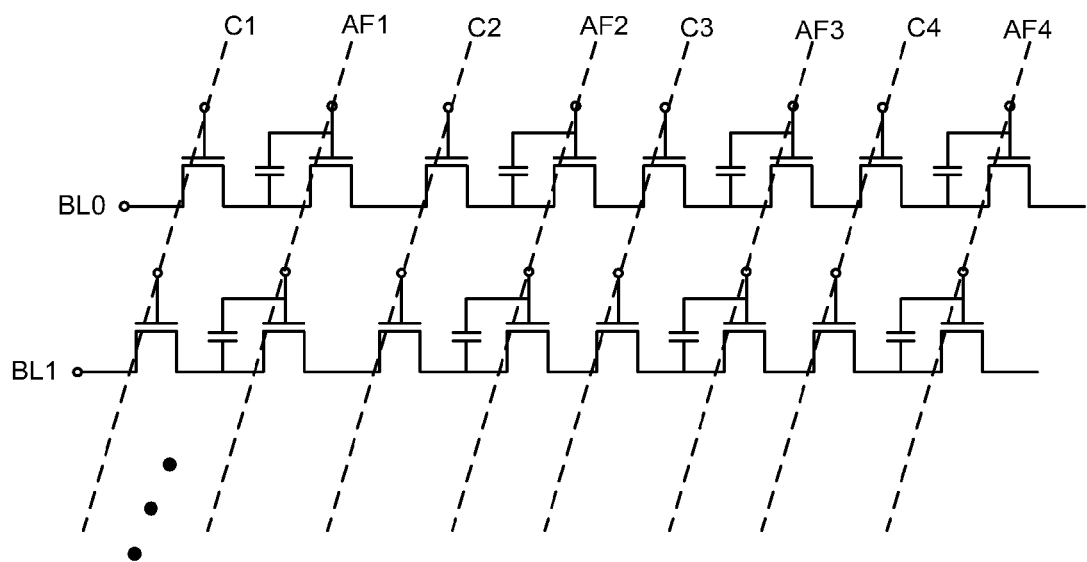
FIG. 2 is a schematic equivalent circuit illustrating a nonvolatile memory composed of several one-bit memory cells.

FIG. 2 is a schematic equivalent circuit illustrating a nonvolatile memory composed of several one-bit memory cells. The nonvolatile memory, which acts as nand-type is composed of two or more one-bit memory cells. In this embodiment, the nonvolatile memory is composed of two one-bit memory cells. Consequently, the nonvolatile memory can provide a two-bit data, including the zeroth bit data (BL0) and the first bit data (BL1). In a case that the nonvolatile memory is composed of more than two one-bit memory cells, the way of connecting these one-bit memory cells is similar to that of FIG. 2, and is not redundantly described herein. FIG. 2 is a 4 cycle sample.

In the two one-bit memory cells of FIG. 2, the gates of the control transistors of all first storage units are connected to the first control signal line C1, and the gates of the anti-fuse transistors of all first storage units are connected to the first anti-fuse signal line AF1. The gates of the control transistors of all second storage units are connected to the second control signal line C2, and the gates of the anti-fuse transistors of all second storage units are connected to the second anti-fuse signal line AF2. The gates of the control transistors of all third storage units are connected to the third control signal line C3, and the gates of the anti-fuse transistors of all third storage units are connected to the third anti-fuse signal line AF3. The gates of the control transistors of all fourth storage units are connected to the fourth control signal line C4, and the gates of the anti-fuse transistors of all fourth storage units are connected to the fourth anti-fuse signal line AF4.

The one-bit memory cell of the present invention may be used as a multi-time programming memory (MTP memory) or a one time programming memory (OTP memory). A method for controlling the programming, erasing and reading actions of the MTP memory will be illustrated in more details as follows.

Figure 3:
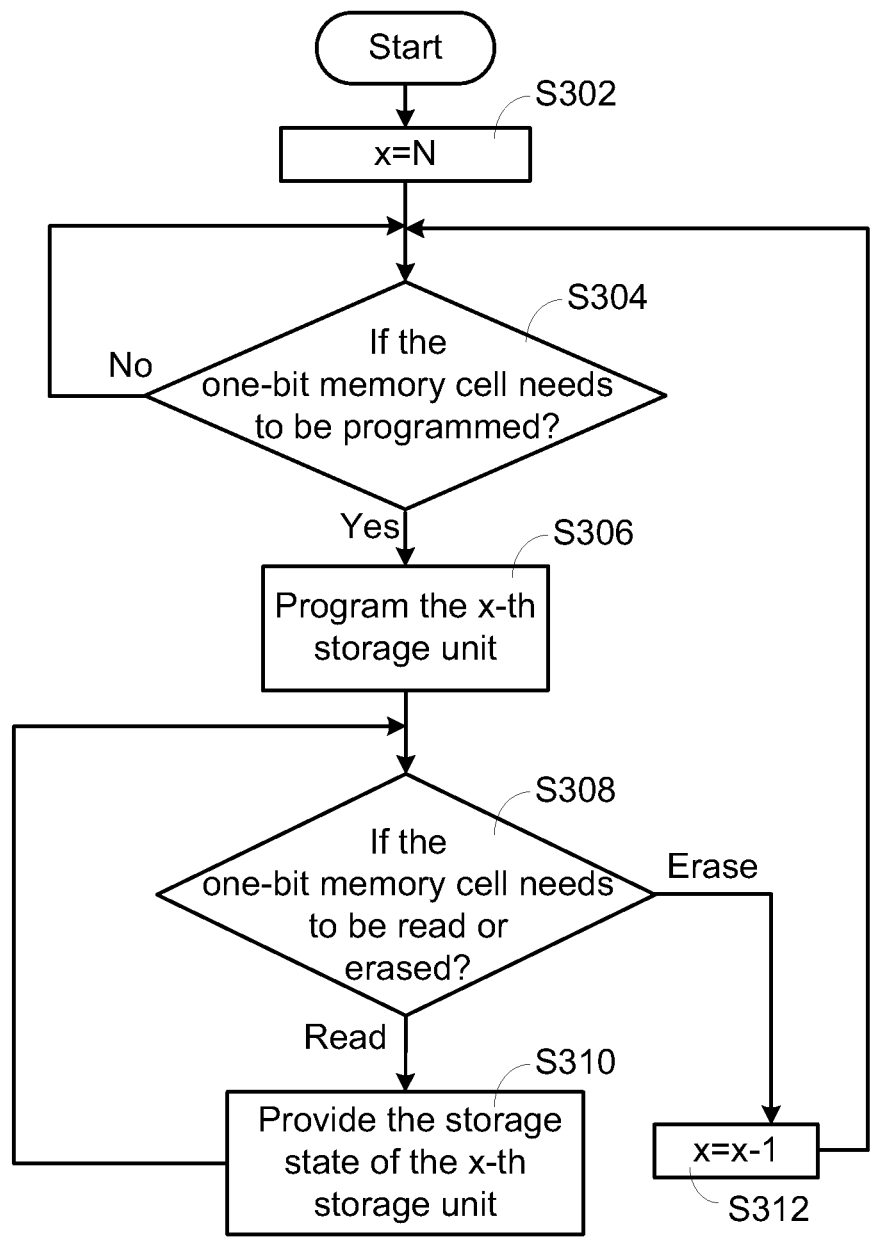
FIG. 3 is a flowchart illustrating a method of controlling the one-bit memory cell according to an embodiment of the present invention, in which the one-bit memory cell is used as a MTP memory.

FIG. 3 is flowchart illustrating a method of controlling the one-bit memory cell according to an embodiment of the present invention, in which the one-bit memory cell is used as a MTP memory. Since the one-bit memory cell is used as the MTP memory, the one-bit memory cell can be programmed and erased many time. In a case that the one-bit memory cell is composed of N serially-connected storage units, the one-bit memory cell can be programmed N times. Moreover, the storage units of the one-bit memory cell are programmed in a backward programming manner.

As shown in FIG. 3, when the one-bit memory cell is in an initial state, set x=N (Step S302). If the one-bit memory cell needs to be programmed (Step S304), the x-th storage unit is programmed (Step S306). In this step, the x-th storage unit may be programmed to be in an off state or an on state.

Then, if the one-bit memory cell needs to be read (Step S308), the storage state of the x-th storage unit is provided (Step S310). If the one-bit memory cell is no longer read but needs to be erased (Step S308), set x=x−1 (Step S312). Meanwhile, the storage state of the x-th storage unit fails to be read.

Furthermore, if the one-bit memory cell needs to be programmed again (Step S304), another storage unit will be programmed (Step S306).

Hereinafter, a controlling mechanism of the flowchart of FIG. 3 will be illustrated by referring to N=4. That is, the one-bit memory cell is composed of four serially-connected storage units. In a case that the one-bit memory cell is programmed at the first time, the storage state (off state or on state) is recorded into the fourth storage unit. If the data of the one-bit memory cell needs to be read, the storage state of the fourth storage unit is provided.

After the one-bit memory cell is erased at the first time, the storage state of the fourth storage unit is directly abandoned. That is, don't care (or ignore) the storage state of the fourth storage unit. Then, in a case that the one-bit memory cell is programmed again, the storage state (off state or on state) is recorded into the third storage unit. If the data of the one-bit memory cell needs to be read, the storage state of the third storage unit is provided.

After the one-bit memory cell is erased again, the storage state of the third storage unit is directly abandoned. That is, don't care the storage state of the third storage unit. Then, in a case that the one-bit memory cell is programmed again, the storage state (off state or on state) is recorded into the second storage unit. If the data of the one-bit memory cell needs to be read, the storage state of the second storage unit is provided.

After the one-bit memory cell is erased again, the storage state of the second storage unit is directly abandoned. That is, don't care the storage state of the second storage unit. Then, in a case that the one-bit memory cell is programmed again, the storage state (off state or on state) is recorded into the first storage unit. If the data of the one-bit memory cell needs to be read, the storage state of the first storage unit is provided.

From the above description, if N=4, the one-bit memory cell can be programmed four times. That is, the one-bit memory cell of the present invention can be used as the MTP memory.

Hereinafter, the voltages of associated signals applied to the one-bit memory cell when the one-bit memory cell is programmed, erased or read will be illustrated in more details. It is assumed that the one-bit memory cell is produced by a standard CMOS fabricating process and the withstanding voltage of each transistor is 3.3V. If the voltage applied to a specified transistor is larger than the withstanding voltage, the gate oxide layer of the specified transistor is ruptured.

FIGS. 4A~4D schematically illustrate the voltages of associated signals applied to the one-bit memory cell when the one-bit memory cell is programmed and read at the first time.

Figure 4A:
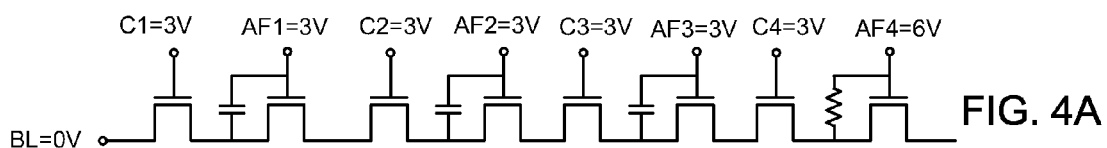
FIGS. 4A~4D schematically illustrate the voltages of associated signals applied to the one-bit memory cell when the one-bit memory cell is programmed and read at the first time.

Please refer to FIG. 4A. In a case that the one-bit memory cell is programmed at the first time and the on state (i.e. the first state) is recorded into the fourth storage unit, a rupture voltage (Vpp, e.g. 6V, which is varied according to the process generation) is provided to only the fourth anti-fuse signal line AF4. An on voltage (Vpp/2, e.g. 3V) is provided to the control signal lines C1~C4 and the anti-fuse signal lines AF1~AF3. In addition, a programmed voltage (e.g. 0V) is provided to the bit line BL. Obviously, since the voltage applied to the fourth storage unit exceeds the withstanding voltage, the gate oxide layer of the anti-fuse transistor in the fourth storage unit is ruptured. Consequently, the both ends of the capacitor in the fourth storage unit have low impedance. As shown in FIG. 4A, the capacitor is replaced by a resistor when the on state is recorded into the fourth storage unit. Under this circumstance, the fourth storage unit is considered to be in the on state or the first state.

Figure 4B:
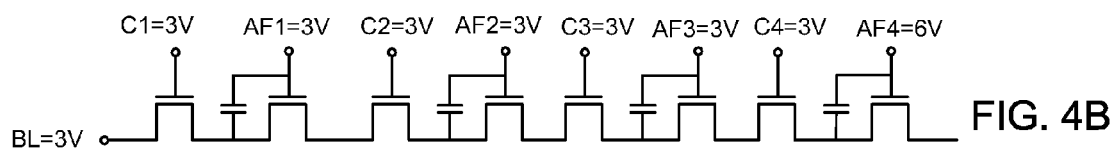

Please refer to FIG. 4B. In a case that the one-bit memory cell is programmed at the first time and the off state (i.e. the second state) is recorded into the fourth storage unit, a rupture voltage (e.g. 6V) is provided to only the fourth anti-fuse signal line AF4. An on voltage (e.g. 3V) is provided to the control signal lines C1~C4 and the anti-fuse signal lines AF1~AF3. In addition, a non-programmed voltage (e.g. 3V) is provided to the bit line BL. Obviously, the gate oxide layer of the anti-fuse transistor in the fourth storage unit is not ruptured. Consequently, the both ends of the capacitor in the fourth storage unit have high impedance. Under this circumstance, the fourth storage unit is considered to be in the off state or the second state. Furthermore, the non-programmed voltage (e.g. 3V) provided to the bit line BL is also called as the program inhibition. That is to say, when the non-programmed voltage (e.g. 3V) is provided to the bit line BL in program inhibition, the prior programmed storage unit (in the on state or off state) is maintained and will not be influenced or programmed again.

Figure 4C:
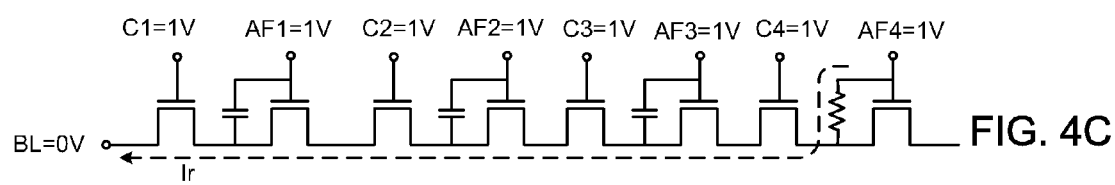

Please refer to FIG. 4C. After the one-bit memory cell is programmed at the first time and the on state (i.e. the first state) is recorded into the fourth storage unit, the one-bit memory cell is read. Under this circumstance, a read control voltage (e.g. 1V) is provided to the control signal lines C1~C4 and the anti-fuse signal lines AF1~AF4. In addition, a bit line reading voltage (e.g. 0V) is provided to the bit line BL. As shown in FIG. 4C, since the gate oxide layer of the anti-fuse transistor in the fourth storage unit has been ruptured and the both ends of the capacitor in the fourth storage unit have low impedance, a larger reading current Ir may flow from the fourth anti-fuse signal line AF4 to the bit line BL. After the reading current Ir is sensed by a sense amplifier (not shown), the on state (i.e. the first state) of the one-bit memory cell is detected. According to the present invention, the voltage provided to the control signal lines C1~C4 and the anti-fuse signal lines AF1~AF4 is the read control voltage (e.g. 1V) when reading the one-bit memory cell. However, the voltages provided to the control signal lines C1~C4 and the anti-fuse signal lines AF1~AF4 could be different. For example, a first read control voltage (e.g. 1V) is provided to the control signal lines C1~C4 and a second read control voltage (e.g. 1.2V) is provided to the anti-fuse signal lines AF1~AF4 when reading the one-bit memory cell.

Figure 4D:
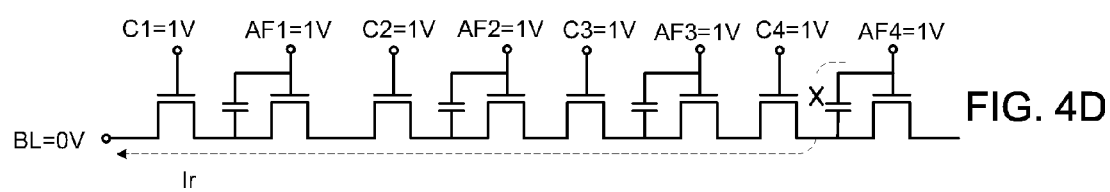

Please refer to FIG. 4D. After the one-bit memory cell is programmed at the first time and the off state (i.e. the second state) is recorded into the fourth storage unit, the one-bit memory cell is read. Under this circumstance, a read control voltage (e.g. 1V) is provided to the control signal lines C1~C4 and the anti-fuse signal lines AF1~AF4. In addition, a bit line reading voltage (e.g. 0V) is provided to the bit line BL. As shown in FIG. 4D, since the gate oxide layer of the anti-fuse transistor in the fourth storage unit has not been ruptured and the both ends of the capacitor in the fourth storage unit have high impedance, a tiny reading current Ir (nearly zero) may flow from the fourth anti-fuse signal line AF4 to the bit line BL. After the reading current Ir is sensed by a sense amplifier (not shown), the off state (i.e. the second state) of the one-bit memory cell is detected.

After the one-bit memory cell is erased at the first time, the storage state of the fourth storage unit is directly abandoned. Then, regardless of whether the one-bit memory cell is programmed or read, an off voltage (e.g. 0V) is provided to the fourth control signal line C4 and the fourth anti-fuse signal line AF4. Consequently, the subsequent programming actions and reading actions are not influenced by the storage state of the fourth storage unit.

FIGS. 5A~5D schematically illustrate the voltages of associated signals applied to the one-bit memory cell when the one-bit memory cell is programmed and read at the second time.

Please refer to FIG. 5A. In a case that the one-bit memory cell is programmed at the second time and the on state (i.e. the first state) is recorded into the third storage unit, a rupture voltage (e.g. 6V) is provided to only the third anti-fuse signal line AF3. An on voltage (e.g. 3V) is provided to the control signal lines C1~C3 and the anti-fuse signal lines AF1~AF2. In addition, a programmed voltage (e.g. 0V) is provided to the bit line BL. Obviously, since the voltage applied to the third storage unit exceeds the withstanding voltage, the gate oxide layer of the anti-fuse transistor in the third storage unit is ruptured. Consequently, the both ends of the capacitor in the third storage unit have low impedance. Under this circumstance, the third storage unit is considered to be in the on state or the first state. Furthermore, since the off voltage (0V) is provided to the control signal line C4, the second program action is not influenced by the storage state of the fourth storage unit.

Please refer to FIG. 5B. In a case that the one-bit memory cell is programmed at the second time and the off state (i.e. the second state) is recorded into the third storage unit, a rupture voltage (e.g. 6V) is provided to only the third anti-fuse signal line AF3. An on voltage (e.g. 3V) is provided to the control signal lines C1~C3 and the anti-fuse signal lines AF1~AF2. In addition, a non-programmed voltage (e.g. 3V) is provided to the bit line BL. Obviously, the gate oxide layer of the anti-fuse transistor in the third storage unit is not ruptured. Consequently, the both ends of the capacitor in the third storage unit have high impedance. Under this circumstance, the third storage unit is considered to be in the off state or the second state. The same, the non-programmed voltage (e.g. 3V) provided to the bit line BL is capable of protecting the prior programmed storage unit from being programmed again in the program inhibition.

Please refer to FIG. 5C. After the one-bit memory cell is programmed at the second time and the on state (i.e. the first state) is recorded into the third storage unit, the one-bit memory cell is read. Under this circumstance, a read control voltage (e.g. 1V) is provided to the control signal lines C1~C3 and the anti-fuse signal lines AF1~AF3. In addition, a bit line reading voltage (e.g. 0V) is provided to the bit line BL. As shown in FIG. 5C, since the gate oxide layer of the anti-fuse transistor in the third storage unit has been ruptured and the both ends of the capacitor in the third storage unit have low impedance, a larger reading current Ir may flow from the third anti-fuse signal line AF3 to the bit line BL. After the reading current Ir is sensed by a sense amplifier (not shown), the on state (i.e. the first state) of the one-bit memory cell is detected.

Please refer to FIG. 5D. After the one-bit memory cell is programmed at the second time and the off state (i.e. the second state) is recorded into the third storage unit, the one-bit memory cell is read. Under this circumstance, a read control voltage (e.g. 1V) is provided to the control signal lines C1~C3 and the anti-fuse signal lines AF1~AF3. In addition, a bit line reading voltage (e.g. 0V) is provided to the bit line BL. As shown in FIG. 5D, since the gate oxide layer of the anti-fuse transistor in the third storage unit has not been ruptured and the both ends of the capacitor in the third storage unit have high impedance, a tiny reading current Ir (nearly zero) may flow from the third anti-fuse signal line AF3 to the bit line BL. After the reading current Ir is sensed by a sense amplifier (not shown), the off state (i.e. the second state) of the one-bit memory cell is detected.

After the one-bit memory cell is erased at the second time, the storage state of the third storage unit is directly abandoned. Then, regardless of whether the one-bit memory cell is programmed or read, an off voltage (e.g. 0V) is provided to the control signal lines C3~C4 and the anti-fuse signal lines AF3~AF4. Consequently, the subsequent programming actions and reading actions are not influenced by the storage states of the third storage unit and the fourth storage unit.

FIGS. 6A~6D schematically illustrate the voltages of associated signals applied to the one-bit memory cell when the one-bit memory cell is programmed and read at the third time.

Figure 6A:
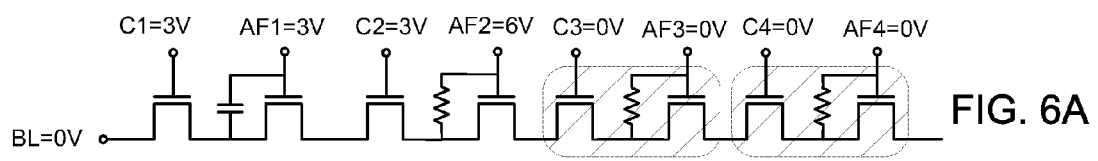
FIGS. 6A~6D schematically illustrate the voltages of associated signals applied to the one-bit memory cell when the one-bit memory cell is programmed and read at the third time.

Please refer to FIG. 6A. In a case that the one-bit memory cell is programmed at the third time and the on state (i.e. the first state) is recorded into the second storage unit, a rupture voltage (e.g. 6V) is provided to only the second anti-fuse signal line AF2. An on voltage (e.g. 3V) is provided to the control signal lines C1~C2 and the first anti-fuse signal line AF1. In addition, a programmed voltage (e.g. 0V) is provided to the bit line BL. Obviously, since the voltage applied to the second storage unit exceeds the withstanding voltage, the gate oxide layer of the anti-fuse transistor in the second storage unit is ruptured. Consequently, the both ends of the capacitor in the second storage unit have low impedance. Under this circumstance, the second storage unit is considered to be in the on state or the first state.

Figure 6B:
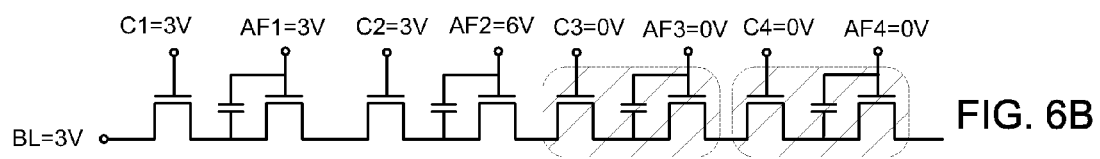

Please refer to FIG. 6B. In a case that the one-bit memory cell is programmed at the third time and the off state (i.e. the second state) is recorded into the second storage unit, a rupture voltage (e.g. 6V) is provided to only the second anti-fuse signal line AF2. An on voltage (e.g. 3V) is provided to the control signal lines C1~C2 and the first anti-fuse signal line AF1. In addition, a non-programmed voltage (e.g. 3V) is provided to the bit line BL. Obviously, the gate oxide layer of the anti-fuse transistor in the second storage unit is not ruptured. Consequently, the both ends of the capacitor in the second storage unit have high impedance. Under this circumstance, the second storage unit is considered to be in the off state or the second state.

Figure 6C:
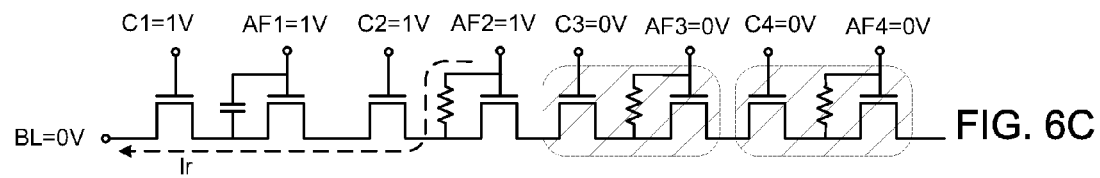

Please refer to FIG. 6C. After the one-bit memory cell is programmed at the third time and the on state (i.e. the first state) is recorded into the second storage unit, the one-bit memory cell is read. Under this circumstance, a read control voltage (e.g. 1V) is provided to the control signal lines C1~C2 and the anti-fuse signal lines AF1~AF2. In addition, a bit line reading voltage (e.g. 0V) is provided to the bit line BL. As shown in FIG. 6C, since the gate oxide layer of the anti-fuse transistor in the second storage unit has been ruptured and the both ends of the capacitor in the second storage unit have low impedance, a larger reading current Ir may flow from the second anti-fuse signal line AF2 to the bit line BL. After the reading current Ir is sensed by a sense amplifier (not shown), the on state (i.e. the first state) of the one-bit memory cell is detected.

Figure 6D:
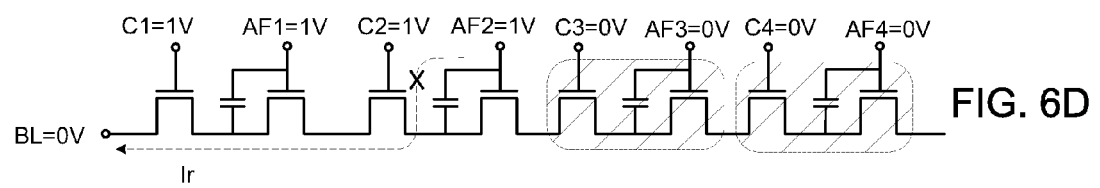

Please refer to FIG. 6D. After the one-bit memory cell is programmed at the third time and the off state (i.e. the second state) is recorded into the second storage unit, the one-bit memory cell is read. Under this circumstance, a read control voltage (e.g. 1V) is provided to the control signal lines C1~C2 and the anti-fuse signal lines AF1~AF2. In addition, a bit line reading voltage (e.g. 0V) is provided to the bit line BL. As shown in FIG. 6D, since the gate oxide layer of the anti-fuse transistor in the second storage unit has not been ruptured and the both ends of the capacitor in the second storage unit have high impedance, a tiny reading current Ir (nearly zero) may flow from the second anti-fuse signal line AF2 to the bit line BL. After the reading current Ir is sensed by a sense amplifier (not shown), the off state (i.e. the second state) of the one-bit memory cell is detected.

After the one-bit memory cell is erased at the third time, the storage state of the second storage unit is directly abandoned. Then, regardless of whether the one-bit memory cell is programmed or read, an off voltage (e.g. 0V) to the control signal lines C2~C4 and the anti-fuse signal lines AF2~AF4. Consequently, the subsequent programming actions and reading actions are not influenced by the storage states of the second, third storage and fourth storage units.

FIGS. 7A~7D schematically illustrate the voltages of associated signals applied to the one-bit memory cell when the one-bit memory cell is programmed and read at the fourth time.

Figure 7A:
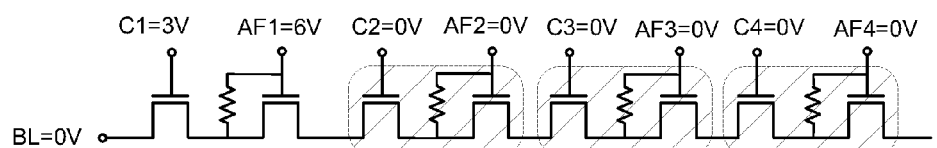
FIGS. 7A~7D schematically illustrate the voltages of associated signals applied to the one-bit memory cell when the one-bit memory cell is programmed and read at the fourth time.

Please refer to FIG. 7A. In a case that the one-bit memory cell is programmed at the fourth time and the on state (i.e. the first state) is recorded into the first storage unit, a rupture voltage (e.g. 6V) is provided to only the first anti-fuse signal line AF1. An on voltage (e.g. 3V) is provided to the first control signal line C1. In addition, a programmed voltage (e.g. 0V) is provided to the bit line BL. Obviously, since the voltage applied to the first storage unit exceeds the withstanding voltage, the gate oxide layer of the anti-fuse transistor in the first storage unit is ruptured. Consequently, the both ends of the capacitor in the first storage unit have low impedance. Under this circumstance, the first storage unit is considered to be in the on state or the first state.

Figure 7B:
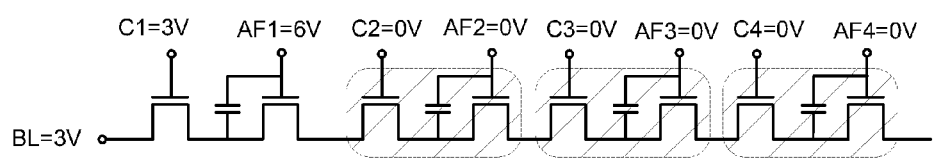

Please refer to FIG. 7B. In a case that the one-bit memory cell is programmed at the fourth time and the off state (i.e. the second state) is recorded into the first storage unit, a rupture voltage (e.g. 6V) is provided to only the first anti-fuse signal line AF1. An on voltage (e.g. 3V) is provided to first control signal line C1. In addition, a non-programmed voltage (e.g. 3V) is provided to the bit line BL. Obviously, the gate oxide layer of the anti-fuse transistor in the first storage unit is not ruptured. Consequently, the both ends of the capacitor in the first storage unit have high impedance. Under this circumstance, the first storage unit is considered to be in the off state or the second state.

Figure 7C:
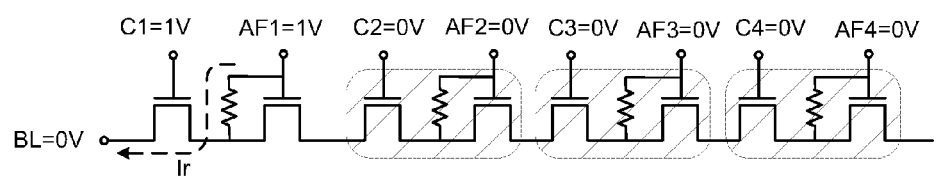

Please refer to FIG. 7C. After the one-bit memory cell is programmed at the fourth time and the on state (i.e. the first state) is recorded into the first storage unit, the one-bit memory cell is read. Under this circumstance, a read control voltage (e.g. 1V) is provided to the first control signal line C1 and the first anti-fuse signal line AF1. In addition, a bit line reading voltage (e.g. 0V) is provided to the bit line BL. As shown in FIG. 7C, since the gate oxide layer of the anti-fuse transistor in the first storage unit has been ruptured and the both ends of the capacitor in the first storage unit have low impedance, a larger reading current Ir may flow from the first anti-fuse signal line AF1 to the bit line BL. After the reading current Ir is sensed by a sense amplifier (not shown), the on state (i.e. the first state) of the one-bit memory cell is detected.

Figure 7D:
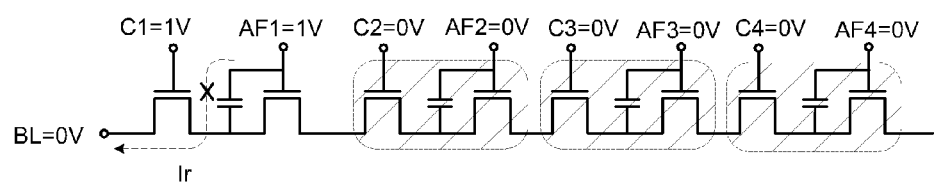

Please refer to FIG. 7D. After the one-bit memory cell is programmed at the third time and the off state (i.e. the second state) is recorded into the first storage unit, the one-bit memory cell is read. Under this circumstance, a read control voltage (e.g. 1V) is provided to the first control signal line C1 and the first anti-fuse signal line AF1. In addition, a bit line reading voltage (e.g. 0V) is provided to the bit line BL. As shown in FIG. 7D, since the gate oxide layer of the anti-fuse transistor in the first storage unit has not been ruptured and the both ends of the capacitor in the first storage unit have high impedance, a tiny reading current Ir (nearly zero) may flow from the first anti-fuse signal line AF1 to the bit line BL. After the reading current Ir is sensed by a sense amplifier (not shown), the off state (i.e. the second state) of the one-bit memory cell is detected.

From the above discussions, the one-bit memory cell of the present invention may be applied to a nonvolatile memory and have the function of the MTP memory.

Moreover, the one-bit memory cell of the present invention may be used as a one time programming memory (OTP memory). A method for controlling the programming and reading actions of the OTP memory will be illustrated in more details as follows.

Figure 8:
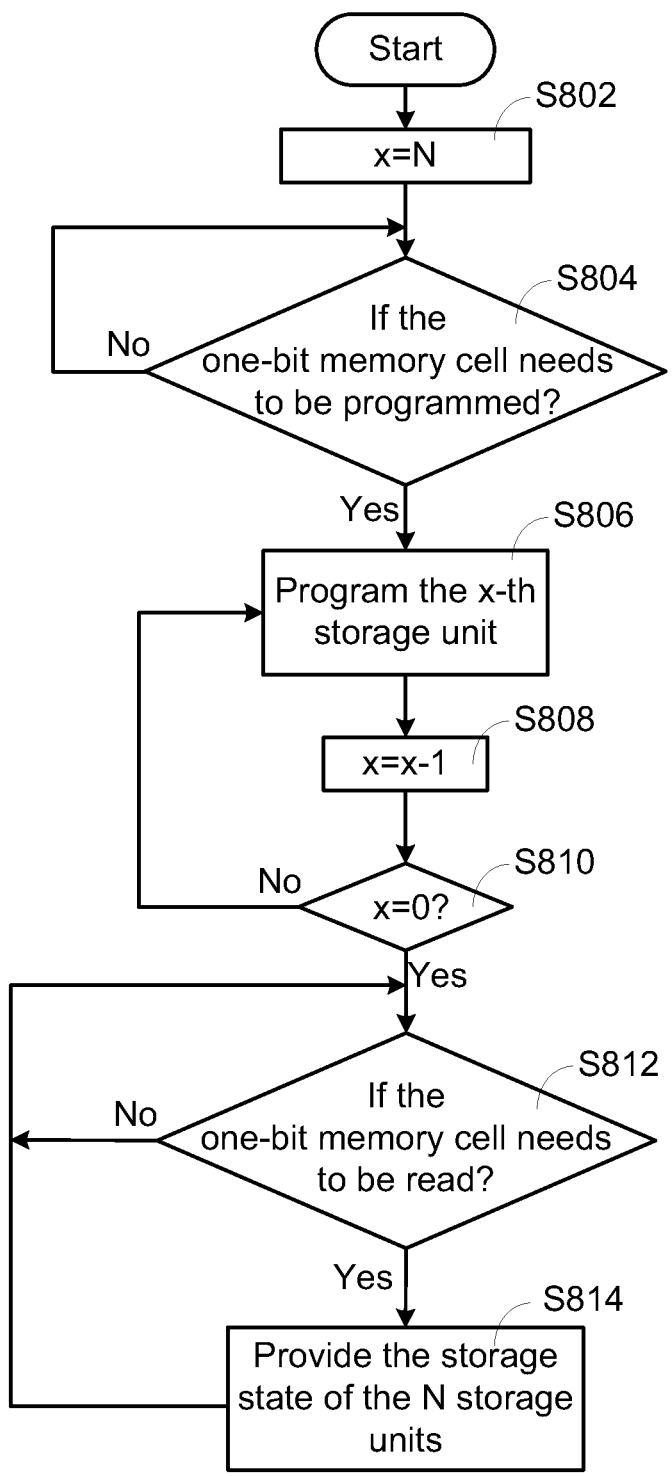
FIG. 8 is flowchart illustrating a method of controlling the one-bit memory cell according to an embodiment of the present invention, in which the one-bit memory cell is used as an OTP memory.

FIG. 8 is flowchart illustrating a method of controlling the one-bit memory cell according to an embodiment of the present invention, in which the one-bit memory cell is used as an OTP memory. Since the one-bit memory cell is used as the OTP memory, the one-bit memory cell can be programmed once and cannot be erased. In a case that the one-bit memory cell is composed of N serially-connected storage units, for programming the one-bit memory cell, an identical storage state is recorded into all of the N storage units in a backward programming manner.

As shown in FIG. 8, when the one-bit memory cell is in an initial state, set x=N (Step S802). If the one-bit memory cell needs to be programmed (Step S804), the x-th storage unit is programmed (Step S806).

That is, the storage state is recorded into the x-th storage unit. Then, set x=x−1 (Step S808), and go back to the step S806 until x=0 (Step S810). The steps S806, S808 and S810 are employed to sequentially record the storage state in N storage units in N program cycles.

Then, if the one-bit memory cell needs to be read (Step S812), the storage state of the N storage units is provided simultaneously (Step S814).

Hereinafter, a controlling mechanism of the flowchart of FIG. 8 will be illustrated by referring to N=4. That is, the one-bit memory cell is composed of four serially-connected storage units. In a case that the one-bit memory cell is programmed, the storage state (off state or on state) is recorded into the all of the four storage units. If the data of the one-bit memory cell needs to be read, the identical storage state of the four storage units is provided simultaneously.

Hereinafter, the voltages of associated signals applied to the one-bit memory cell when the one-bit memory cell is programmed or read will be illustrated in more details. It is assumed that the one-bit memory cell is produced by a standard CMOS fabricating process and the withstanding voltage of each transistor is 3.3V. If the voltage applied to a specified transistor is larger than the withstanding voltage, the gate oxide layer of the specified transistor is ruptured.

FIGS. 9A~9E schematically illustrate the voltages of associated signals applied to the one-bit memory cell when the one-bit memory cell is programmed and read in an on state.

Figure 9A:
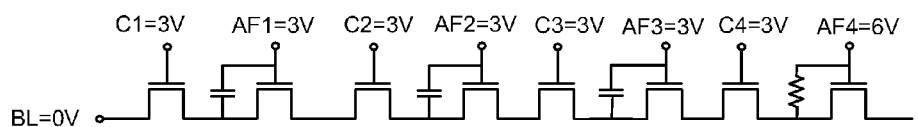
FIGS. 9A~9E schematically illustrate the voltages of associated signals applied to the one-bit memory cell when the one-bit memory cell is programmed and read in an on state.

Please refer to FIG. 9A. During a first program period, the on state (i.e. the first state) is recorded into the fourth storage unit. Under this circumstance, a rupture voltage (e.g. 6V) is provided to only the fourth anti-fuse signal line AF4. An on voltage (e.g. 3V) is provided to the control signal lines C1~C4 and the anti-fuse signal lines AF1~AF3. In addition, a programmed voltage (e.g. 0V) is provided to the bit line BL. Obviously, since the voltage applied to the fourth storage unit exceeds the withstanding voltage, the gate oxide layer of the anti-fuse transistor in the fourth storage unit is ruptured. Consequently, the both ends of the capacitor in the fourth storage unit have low impedance. Under this circumstance, the fourth storage unit is considered to be in the on state or the first state.

Figure 9B:
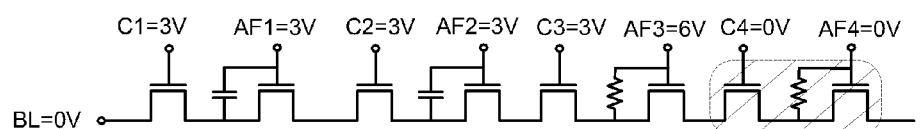

Please refer to FIG. 9B. During a second program period, the on state (i.e. the first state) is recorded into the third storage unit. Under this circumstance, an off voltage (e.g. 0V) is provided to the fourth control signal line C4 and the fourth anti-fuse signal line AF4. A rupture voltage (e.g. 6V) is provided to the third anti-fuse signal line AF3. An on voltage (e.g. 3V) is provided to the control signal lines C1~C3 and the anti-fuse signal lines AF1~AF2. In addition, a programmed voltage (e.g. 0V) is provided to the bit line BL. Obviously, since the voltage applied to the third storage unit exceeds the withstanding voltage, the gate oxide layer of the anti-fuse transistor in the third storage unit is ruptured. Consequently, the both ends of the capacitor in the third storage unit have low impedance. Under this circumstance, the third storage unit is considered to be in the on state or the first state.

Figure 9C:
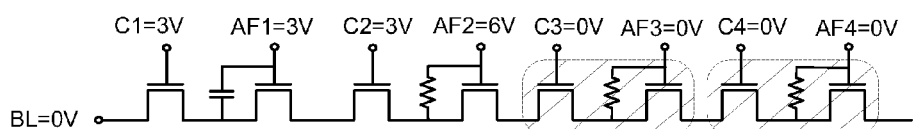

Please refer to FIG. 9C. During a third program period, the on state (i.e. the first state) is recorded into the second storage unit. Under this circumstance, an off voltage (e.g. 0V) is provided to the control signal lines C3~C4 and the anti-fuse signal lines AF3~AF4. A rupture voltage (e.g. 6V) is provided to the second anti-fuse signal line AF2. An on voltage (e.g. 3V) is provided to the control signal lines C1~C2 and the first anti-fuse signal line AF1. In addition, a programmed voltage (e.g. 0V) is provided to the bit line BL. Obviously, since the voltage applied to the second storage unit exceeds the withstanding voltage, the gate oxide layer of the anti-fuse transistor in the second storage unit is ruptured. Consequently, the both ends of the capacitor in the second storage unit have low impedance. Under this circumstance, the second storage unit is considered to be in the on state or the first state.

Figure 9D:
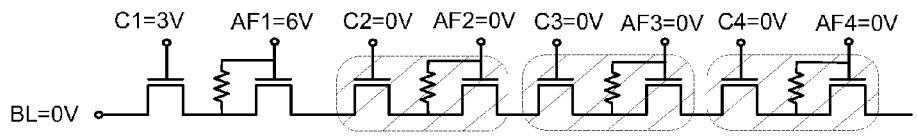

Please refer to FIG. 9D. During a fourth program period, the on state (i.e. the first state) is recorded into the first storage unit. Under this circumstance, an off voltage (e.g. 0V) is provided to the control signal lines C2~C4 and the anti-fuse signal lines AF2~AF4. A rupture voltage (e.g. 6V) is provided to first anti-fuse signal line AF1 provides. An on voltage (e.g. 3V) is provided to first control signal line C1. In addition, a programmed voltage (e.g. 0V) is provided to the bit line BL. Obviously, since the voltage applied to the first storage unit exceeds the withstanding voltage, the gate oxide layer of the anti-fuse transistor in the first storage unit is ruptured. Consequently, the both ends of the capacitor in the first storage unit have low impedance. Under this circumstance, the first storage unit is considered to be in the on state or the first state.

Figure 9E:
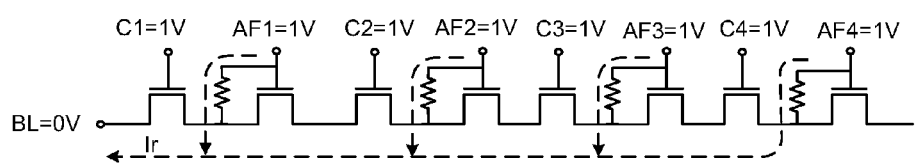

Please refer to FIG. 9E. After the on state (i.e. the first state) is recorded into all of the four storage units, for reading the one-bit memory cell, a read control voltage (e.g. 1V) is provided to the control signal lines C1~C4 and the anti-fuse signal lines AF1~AF4. In addition, a bit line reading voltage (e.g. 0V) is provided to the bit line BL. As shown in FIG. 9E, since the gate oxide layers of the anti-fuse transistors in the four storage units have been ruptured and the impedance is low, the sum of the currents flowing from all anti-fuse signal lines to the bit line BL is equal to a reading current Ir. Obviously, the reading current Ir is very high. After the reading current Ir is sensed by a sense amplifier (not shown), the on state (i.e. the first state) of the one-bit memory cell is detected. According to the present invention, the voltage provided to the control signal lines C1~C4 and the anti-fuse signal lines AF1~AF4 is the read control voltage (e.g. 1V) when reading the one-bit memory cell. However, the voltages provided to the control signal lines C1~C4 and the anti-fuse signal lines AF1~AF4 could be different. For example, a first read control voltage (e.g. 1V) is provided to the control signal lines C1~C4 and a second read control voltage (e.g. 1.2V) is provided to the anti-fuse signal lines AF1~AF4 when reading the one-bit memory cell.

In the above embodiment, the one-bit memory cell of the present invention is used as the OTP memory. Whenever the gate oxide layer is ruptured successfully during one program cycle, the one-bit memory cell may be considered to be in the on state (i.e. the first state) according to the reading current. Consequently, even if the semiconductor fabricating process is subject to deviation and the gate oxide layer fails to be successfully ruptured during some program periods, the storage state of the one-bit memory cell can be accurately judged.

FIGS. 10A~10E schematically illustrate the voltages of associated signals applied to the one-bit memory cell when the one-bit memory cell is programmed and read in an off state.

Figure 10A:
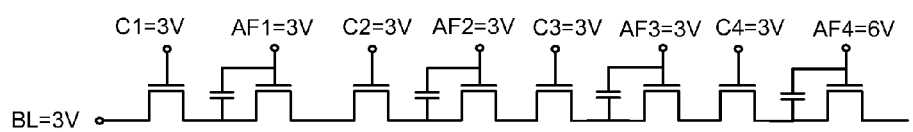
FIGS. 10A~10E schematically illustrate the voltages of associated signals applied to the one-bit memory cell when the one-bit memory cell is programmed and read in an off state.

Please refer to FIG. 10A. During a first program period, the off state (i.e. the second state) is recorded into the fourth storage unit. Under this circumstance, a rupture voltage is provided to only the fourth anti-fuse signal line AF4 (e.g. 6V). An on voltage (e.g. 3V) is provided to the control signal lines C1~C4 and the anti-fuse signal lines AF1~AF3. In addition, a non-programmed voltage (e.g. 3V) is provided to the bit line BL. Obviously, the gate oxide layer of the anti-fuse transistor in the fourth storage unit is not ruptured. Consequently, the both ends of the capacitor in the fourth storage unit have high impedance. Under this circumstance, the fourth storage unit is considered to be in the off state or the second state.

Figure 10B:
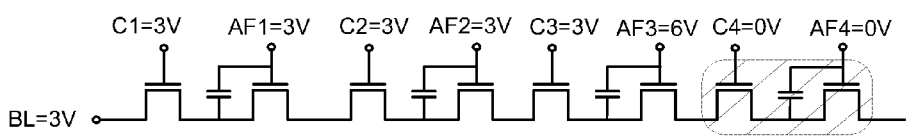

Please refer to FIG. 10B. During a second program period, the off state (i.e. the second state) is recorded into the third storage unit. Under this circumstance, an off voltage (e.g. 0V) is provided to the fourth control signal line C4 and the fourth anti-fuse signal line AF4. A rupture voltage (e.g. 6V) is provided to the third anti-fuse signal line AF3. An on voltage (e.g. 3V) is provided to the control signal lines C1~C3 and the anti-fuse signal lines AF1~AF2. In addition, a non-programmed voltage (e.g. 3V) is provided to the bit line BL. Obviously, the gate oxide layer of the anti-fuse transistor in the third storage unit is not ruptured. Consequently, the both ends of the capacitor in the third storage unit have high impedance. Under this circumstance, the third storage unit is considered to be in the off state or the second state.

Figure 10C:
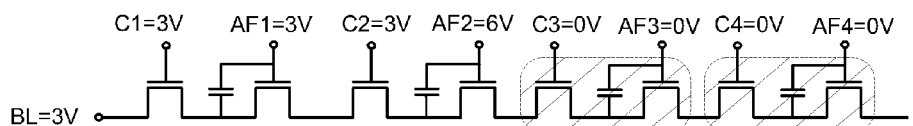

Please refer to FIG. 10C. During a third program period, the off state (i.e. the second state) is recorded into the second storage unit. Under this circumstance, an off voltage (e.g. 0V) is provided to the control signal lines C3~C4 and the anti-fuse signal lines AF3~AF4. A rupture voltage (e.g. 6V) is provided to the second anti-fuse signal line AF2. An on voltage (e.g. 3V) is provided to the control signal lines C1~C2 and the first anti-fuse signal line AF1. In addition, a non-programmed voltage (e.g. 3V) is provided to the bit line BL. Obviously, the gate oxide layer of the anti-fuse transistor in the second storage unit is not ruptured. Consequently, the both ends of the capacitor in the second storage unit have high impedance. Under this circumstance, the second storage unit is considered to be in the off state or the second state.

Figure 10D:
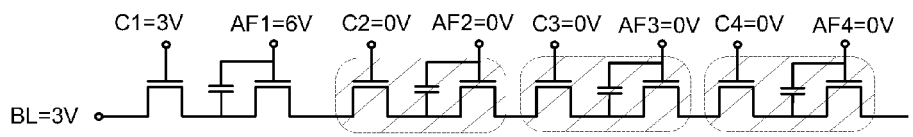

Please refer to FIG. 10D. During a fourth program period, the off state (i.e. the second state) is recorded into the first storage unit. Under this circumstance, an off voltage (e.g. 0V) is provided to the control signal lines C2~C4 and the anti-fuse signal lines AF2~AF4. A rupture voltage (e.g. 6V) is provided to the first anti-fuse signal line AF1. An on voltage (e.g. 3V) is provided to the first control signal line C1. In addition, a non-programmed voltage (e.g. 3V) is provided to the bit line BL. Obviously, the gate oxide layer of the anti-fuse transistor in the first storage unit is not ruptured. Consequently, the both ends of the capacitor in the first storage unit have high impedance. Under this circumstance, the first storage unit is considered to be in the off state or the second state.

Figure 10E:
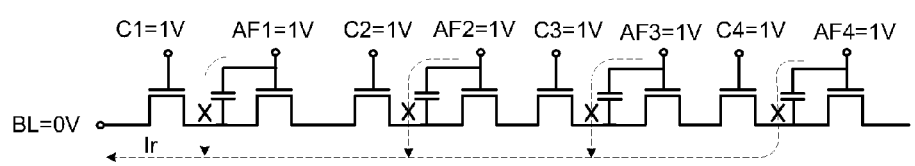

Please refer to FIG. 10E. After the off state (i.e. the second state) is recorded into all of the four storage units, for reading the one-bit memory cell, a read control voltage (e.g. 1V) is provided to the control signal lines C1~C4 and the anti-fuse signal lines AF1~AF4. In addition, a bit line reading voltage (e.g. 0V) is provided to the bit line BL. As shown in FIG. 10E, since the gate oxide layers of the anti-fuse transistors in the four storage units have been not ruptured and the impedance is high, all currents flowing from all anti-fuse signal lines to the bit line BL are very low. Obviously, the reading current Ir is also very low. After the reading current Ir is sensed by a sense amplifier (not shown), the off state (i.e. the second state) of the one-bit memory cell is detected.

From the above discussions, the one-bit memory cell of the present invention may be applied to a nonvolatile memory and have the function of the OTP memory.

It is noted that, however, those skilled in the art will readily observe that numerous modifications and alterations of the storage units may be made while retaining the teachings of the invention.

Figure 11:
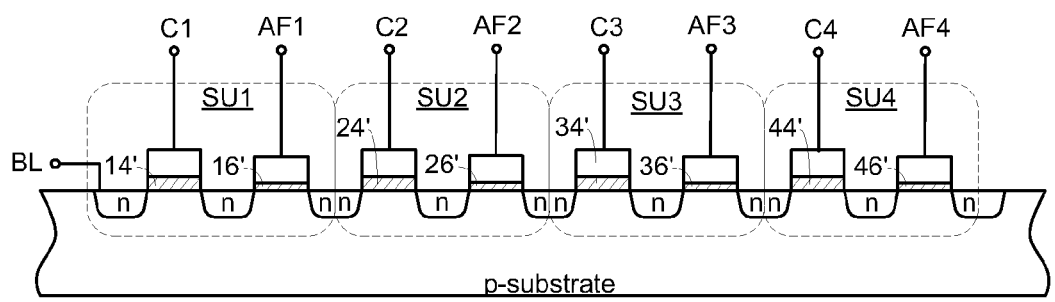
FIG. 11 is a schematic cross-sectional view illustrating a one-bit memory cell for a nonvolatile memory according to a second embodiment of the present invention.

FIG. 11 is a schematic cross-sectional view illustrating a one-bit memory cell for a nonvolatile memory according to a second embodiment of the present invention. Except that the first gate oxide layers 14', 24', 34' and 44' are respectively thicker than the second gate oxide layers 16', 26', 36' and 46', the configurations of the storage units SU1, SU2, SU3 and SU4 of FIG. 11 are substantially identical to those of FIG. 1A. Consequently, during the process of programming the storage unit, the rupture voltage may be reduced or the second gate oxide layer 16', 26', 36' and 46' may be ruptured more easily.

Figure 12:
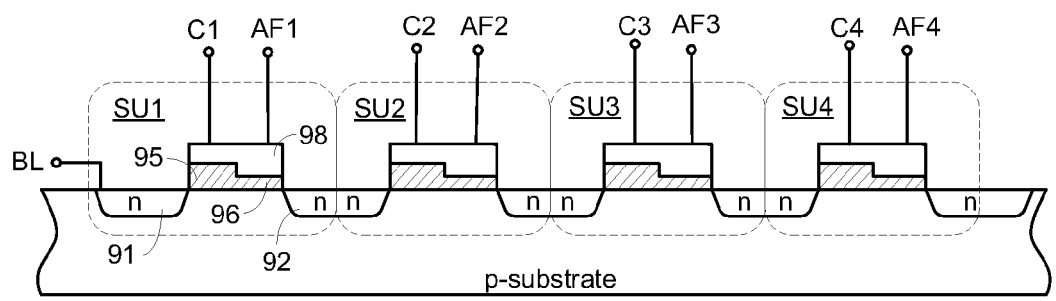
FIG. 12 is a schematic cross-sectional view illustrating a one-bit memory cell for a nonvolatile memory according to a third embodiment of the present invention.

FIG. 12 is a schematic cross-sectional view illustrating a one-bit memory cell for a nonvolatile memory according to a third embodiment of the present invention. Since the storage units SU1, SU2, SU3 and SU4 have identical configurations, only the first storage unit SU1 will be illustrated as follows.

As shown in FIG. 12, the first storage unit SU1 comprises a first n-doped region 91 and a second n-doped region 92, which are formed in the surface of a p-substrate. Moreover, the first n-doped region 91 is connected to a bit line (BL). A channel region is formed between the first n-doped region 91 and the second n-doped region 92. A gate structure is disposed over the channel region. The gate structure comprises a gate oxide layer and a gate conductor layer 98. The gate oxide layer comprises a first part 95 and a second part 96, wherein the first part 95 is thicker than the second part 96. The gate conductor layer 98 is formed over the first part 95 and the second part 96 of the gate oxide layer. A first control signal line C1 is connected to the portion of the gate conductor layer 98 overlying the first part 95 of the gate oxide layer. A first anti-fuse signal line AF1 is connected to the portion of the gate conductor layer 98 overlying the second part 96 of the gate oxide layer.

In the third embodiment, the storage unit is implemented by a single transistor. The first part 95 of the gate oxide layer and the gate conductor layer 98 are collaboratively functioned as a first gate structure of the control transistor. The second part 96 of the gate oxide layer and the gate conductor layer 98 are collaboratively functioned as the second gate structure of an anti-fuse transistor. The one-bit memory cell of the third embodiment may also be used an OTP memory or a MTP memory. The controlling mechanism of the one-bit memory cell of the third embodiment is similar to that of the first embodiment, and is not redundantly described herein.

In the above embodiments, all storage units of the one-bit memory cell have identical configurations. Alternatively, in some embodiments, the configuration of the last storage unit of the serially-connected storage units is different from the configurations of other storage units.

Figure 13:
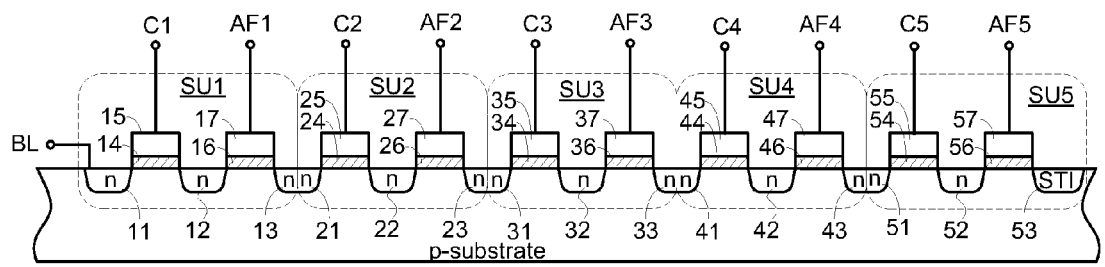
FIG. 13 is a schematic cross-sectional view illustrating a one-bit memory cell for a nonvolatile memory according to a fourth embodiment of the present invention.

FIG. 13 is a schematic cross-sectional view illustrating a one-bit memory cell for a nonvolatile memory according to a fourth embodiment of the present invention.

In comparison with FIG. 1A, the last storage unit SU5 has no third n-doped region. Whereas, the third n-doped region is replaced by an isolation structure 53. For example, the isolation structure 53 is a shallow trench isolation (STI) structure.

As shown in FIG. 13, the fifth storage unit SU5 comprises a first n-doped region 51, a second n-doped region 52 and the isolation structure 53, which are formed in the surface of a p-substrate. A first channel region is formed between the first n-doped region 51 and the second n-doped region 52. A first gate structure is disposed over the first channel region. A third channel region is formed between the second n-doped region 52 and the isolation structure 53. A second gate structure is disposed over the third channel region. The first gate structure comprises a first gate oxide layer 54 and a first gate conductor layer 55. The second gate structure comprises a second gate oxide layer 56 and a second gate conductor layer 57. The first gate conductor layer 55 is connected to a fifth control signal line C5. The second gate conductor layer 57 is connected to a fifth anti-fuse signal line AF5.

The concepts of the fourth embodiment may be combined with the concepts of other embodiments. For example, in the second embodiment, the third n-doped region of the last storage unit of the one-bit memory cell may be replaced by an isolation structure. Similarly, in the third embodiment, the second n-doped region of the last storage unit of the one-bit memory cell may be replaced by an isolation structure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A nonvolatile memory comprising a first one-bit memory cell, wherein the first one-bit memory cell is formed on a substrate, and the first one-bit memory cell comprises:
    a first bit line; and
    N storage units, wherein each of the N storage units comprises a first doped region, a second doped region and a third doped region, which are formed in a surface of the substrate, wherein a first gate structure is disposed over a first channel region between the first doped region and the second doped region, and a second gate structure is disposed over a second channel region between the second doped region and the third doped region,
    wherein the first doped region of the first storage unit is connected to the first bit line, the first gate structure of the first storage unit is connected to a first control signal line, and the second gate structure of the first storage unit is connected to a first anti-fuse signal line, wherein the first doped region of the m-th storage unit is connected to the third doped region of the (m−1)-th storage unit, the first gate structure of the m-th storage unit is connected to an m-th control signal line, and the second gate structure of the m-th storage unit is connected to an m-th anti-fuse signal line, wherein m is an integer larger than or equal to 2 and smaller than or equal to N.

2. The nonvolatile memory as claimed in claim 1, further comprising a second one-bit memory cell, wherein the second one-bit memory cell comprises a second bit line and N storage units, wherein each of the N storage units comprises the first doped region, the second doped region and the third doped region, which are formed in the surface of the substrate, wherein the first gate structure is disposed over the first channel region between the first doped region and the second doped region, and the second gate structure is disposed over the second channel region between the second doped region and the third doped region, wherein the first doped region of the first storage unit is connected to the second bit line, the first gate structure of the first storage unit is connected to the first control signal line, and the second gate structure of the first storage unit is connected to the first anti-fuse signal line, wherein the first doped region of the m-th storage unit is connected to the third doped region of the (m−1)-th storage unit, the first gate structure of the m-th storage unit is connected to the m-th control signal line, and the second gate structure of the m-th storage unit is connected to the m-th anti-fuse signal line.

3. The nonvolatile memory as claimed in claim 1, wherein the first one-bit memory cell further comprises an (N+1)-th storage unit, wherein the (N+1)-th storage unit comprises the first doped region, the second doped region and an isolation structure, which are formed in the surface of the substrate, wherein the first gate structure of the (N+1)-th storage unit is disposed over the first channel region between the first doped region and the second doped region of the (N+1)-th storage unit, and the second gate structure of the (N+1)-th storage unit is disposed over a third channel region between the second doped region and the isolation structure of the (N+1)-th storage unit, wherein the first gate structure of the (N+1)-th storage unit is connected to an (N+1)-th control signal line, the second gate structure of the (N+1)-th storage unit is connected to an (N+1)-th anti-fuse signal line, and the first doped region of the (N+1)-th storage unit is connected to the third doped region of the N-th storage unit.

4. The nonvolatile memory as claimed in claim 1, wherein the first gate structure of each storage unit comprises a first gate oxide layer and a first gate conductor layer, and the second gate structure of each storage unit comprises a second gate oxide layer and a second gate conductor layer, wherein the first gate oxide layer is thicker than the second gate oxide layer.

5. The nonvolatile memory as claimed in claim 1, wherein the substrate is a p-substrate, and all of the first doped region, the second doped region and the third doped region are n-doped regions.

6. The nonvolatile memory as claimed in claim 1, wherein for recording a on state into the y-th storage unit, a program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

7. The nonvolatile memory as claimed in claim 1, wherein for recording an off state into the y-th storage unit, a non-program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

8. The nonvolatile memory as claimed in claim 1, wherein for reading the first one-bit memory cell, a bit line reading voltage is provided to the first bit line, a first read control voltage is provided to the control signal lines from the first control signal line to a y-th control signal line, a second read control voltage is provided to the anti-fuse signal lines from the first anti-fuse signal line to a y-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, so that the first bit line generates a reading current for reading a storage state of the y-th storage unit, wherein y is an integer larger than 1 and smaller than N.

9. The nonvolatile memory as claimed in claim 1, wherein for reading the first one-bit memory cell, a bit line reading voltage is provided to the first bit line, a first read control voltage is provided to all of N control signal lines, and a second read control voltage is provided to all of N anti-fuse signal lines, so that the first bit line generates a reading current.

10. A nonvolatile memory comprising a first one-bit memory cell, wherein the first one-bit memory cell is formed on a substrate, and the first one-bit memory cell comprises:
a first bit line; and
N storage units, which are connected with each other in series, wherein each of the N storage units comprises a control transistor and an anti-fuse transistor;
wherein a first terminal of the control transistor of the first storage unit is connected to the first bit line, a gate terminal of the control transistor of the first storage unit is connected to a first control signal line, a second terminal of the control transistor of the first storage unit is connected to a first terminal of the anti-fuse transistor of the first storage unit, and a gate terminal of the anti-fuse transistor of the first storage unit is connected to a first anti-fuse signal line, wherein a first terminal of the control transistor of the m-th storage unit is connected to a second terminal of the anti-fuse transistor of the (m−1)-th storage unit, a gate terminal of the control transistor of the m-th storage unit is connected to an m-th control signal line, a second terminal of the control transistor of the m-th storage unit is connected to a first terminal of the anti-fuse transistor of the m-th storage unit, and a gate terminal of the anti-fuse transistor of the m-th storage unit is connected to an m-th anti-fuse signal line, wherein m is an integer larger than or equal to 2 and smaller than or equal to N.

11. The nonvolatile memory as claimed in claim 10, further comprising a second one-bit memory cell, wherein the second one-bit memory cell comprises a second bit line and serially-connected N storage units, wherein each of the N storage units comprises the control transistor and the anti-fuse transistor, wherein a first terminal of the control transistor of the first storage unit is connected to the second bit line, a gate terminal of the control transistor of the first storage unit is connected to the first control signal line, a second terminal of the control transistor of the first storage unit is connected to a first terminal of the anti-fuse transistor of the first storage unit, and a gate terminal of the anti-fuse transistor of the first storage unit is connected to the first anti-fuse signal line, wherein a first terminal of the control transistor of the m-th storage unit is connected to a second terminal of the anti-fuse transistor of the (m−1)-th storage unit, a gate terminal of the control transistor of the m-th storage unit is connected to the m-th control signal line, a second terminal of the control transistor of the m-th storage unit is connected to a first terminal of the anti-fuse transistor of the m-th storage unit, and a gate terminal of the anti-fuse transistor of the m-th storage unit is connected to the m-th anti-fuse signal line.

12. The nonvolatile memory as claimed in claim 10, wherein in each storage unit, a gate oxide layer of the control transistor is thicker than a gate oxide layer of the anti-fuse transistor.

13. The nonvolatile memory as claimed in claim 10, wherein for recording a on state into the y-th storage unit, a program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

14. The nonvolatile memory as claimed in claim 10, wherein for recording an off state into the y-th storage unit, a non-program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

15. The nonvolatile memory as claimed in claim 10, wherein for reading the first one-bit memory cell, a bit line reading voltage is provided to the first bit line, a first read control voltage is provided to the control signal lines from the first control signal line to a y-th control signal line, a second read control voltage is provided to the anti-fuse signal lines from the first anti-fuse signal line to a y-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, so that the first bit line generates a reading current for reading a storage state of the y-th storage unit, wherein y is an integer larger than 1 and smaller than N.

16. The nonvolatile memory as claimed in claim 10, wherein for reading the first one-bit memory cell, a bit line reading voltage is provided to the first bit line, a first read control voltage is provided to all of N control signal lines, and a second read control voltage is provided to all of N anti-fuse signal lines, so that the first bit line generates a reading current.

17. A nonvolatile memory comprising a first one-bit memory cell, wherein the first one-bit memory cell is formed on a substrate, and the first one-bit memory cell comprises:
 a first bit line; and
 N storage units, wherein each of the N storage units comprises a first doped region and a second doped region, which are formed in a surface of the substrate, wherein a gate structure is disposed over a channel region between the first doped region and the second doped region, wherein the gate structure comprises a gate oxide layer and a gate conductor layer, wherein the gate oxide layer comprises a first part and a second part, the first part is thicker than the second part, and the gate conductor layer is formed over the gate oxide layer,
 wherein the first doped region of the first storage unit is connected to the first bit line, and the gate structure of the first storage unit is connected to a first control signal line and a first anti-fuse signal line, wherein the first doped region of the m-th storage unit is connected to the second doped region of the (m−1)-th storage unit, and the gate structure of the m-th storage unit is connected to an m-th control signal line and an m-th anti-fuse signal line, wherein m is an integer larger than or equal to 2 and smaller than or equal to N.

18. The nonvolatile memory as claimed in claim 17, wherein the first one-bit memory cell further comprises an (N+1)-th storage unit, wherein the (N+1)-th storage unit comprises the first doped region and an isolation structure, which are formed in the surface of the substrate, wherein the gate structure of the (N+1)-th storage unit is disposed over another channel region between the first doped region and the isolation structure of the (N+1)-th storage unit, wherein the gate structure of the (N+1)-th storage unit is connected to an (N+1)-th control signal line and an (N+1)-th anti-fuse signal line, and the first doped region of the (N+1)-th storage unit is connected to the second doped region of the N-th storage unit.

19. The nonvolatile memory as claimed in claim 17, wherein for recording a on state into the y-th storage unit, a program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

20. The nonvolatile memory as claimed in claim 17, wherein for recording an off state into the y-th storage unit, a non-program voltage is provided to the first bit line, a rupture voltage is provided to a y-th anti-fuse signal line, an on voltage is provided to the control signal lines from the first control signal line to a y-th control signal line and the anti-fuse signal lines from the first anti-fuse signal line to a (y−1)-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, wherein y is an integer larger than 1 and smaller than N.

21. The nonvolatile memory as claimed in claim 17, wherein for reading the first one-bit memory cell, a bit line reading voltage is provided to the first bit line, a first read control voltage is provided to the control signal lines from the first control signal line to a y-th control signal line, a second read control voltage is provided to the anti-fuse signal lines from the first anti-fuse signal line to a y-th anti-fuse signal line, and an off voltage is provided to the control signal lines from a (y+1)-th control signal line to an N-th control signal line and the anti-fuse signal lines from a (y+1)-th anti-fuse signal line to an N-th anti-fuse signal line, so that the first bit line generates a reading current for reading a storage state of the y-th storage unit, wherein y is an integer larger than 1 and smaller than N.

22. The nonvolatile memory as claimed in claim 17, wherein for reading the first one-bit memory cell, a bit line reading voltage is provided to the first bit line, a first read control voltage is provided to all of N control signal lines, and a second read control voltage is provided to all of N anti-fuse signal lines, so that the first bit line generates a reading current.

23. A method for controlling a one-bit memory cell of a nonvolatile memory, the one-bit memory cell comprising a bit line and N storage units, the N storage units being connected with each other in series, the bit line being connected to a first storage unit of the N storage units, the method comprising steps of:
 (a) if the one-bit memory cell needs to be programmed, programming a x-th storage unit, so that a storage state of the x-th storage unit is provided when the one-bit memory cell is read;
 (b) if the one-bit memory cell needs to be erased, ignoring the storage state of the x-th storage unit; and
 (c) if the one-bit memory cell needs to be programmed again, programming a (x−1)-th storage unit, so that a storage state of the (x−1)-th storage unit is provided when the one-bit memory cell is read, wherein x is an integer larger than or equal to 2 and smaller than or equal to N.

24. A method for controlling a one-bit memory cell of a nonvolatile memory, the one-bit memory cell comprising a bit line and N storage units, the N storage units being connected with each other in series, the bit line being connected to a first storage unit of the N storage units, the method comprising steps of:
 (a) if the one-bit memory cell needs to be programmed, sequentially programming the N storage units in N program cycles, so that a storage state is recorded into all of the N storage units; and
 (b) if the one-bit memory cell needs to be read, providing the storage state of the N storage units simultaneously.

* * * * *